United States Patent
Beitler et al.

(10) Patent No.: US 9,672,928 B2
(45) Date of Patent: Jun. 6, 2017

(54) METHOD AND APPARATUS FOR ESTIMATING READ LEVELS OF NONVOLATILE MEMORY AND FOR PROGRAMMING PILOT SIGNALS USED FOR SUCH ESTIMATION

(71) Applicant: SAMSUNG ELECTRONICS CO., LTD., Suwon-si, Gyeonggi-do (KR)

(72) Inventors: Uri Beitler, Rehovot (IL); Jun Jin Kong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/937,333

(22) Filed: Nov. 10, 2015

(65) Prior Publication Data

US 2017/0133097 A1    May 11, 2017

(51) Int. Cl.
| | | |
|---|---|---|
| *G11C 16/10* | (2006.01) | |
| *G11C 16/26* | (2006.01) | |
| *G11C 16/06* | (2006.01) | |
| *G11C 11/56* | (2006.01) | |

(52) U.S. Cl.
CPC .............. *G11C 16/26* (2013.01); *G11C 16/10* (2013.01); *G11C 11/5642* (2013.01); *G11C 16/06* (2013.01)

(58) Field of Classification Search
CPC ..... G11C 16/26; G11C 16/10; G06F 12/0246; G06F 11/34
USPC .................................................... 365/185.12
See application file for complete search history.

(56) References Cited

U.S. PATENT DOCUMENTS

| | | | |
|---|---|---|---|
| 7,768,830 B2 | 8/2010 | Shibata et al. | |
| 7,941,590 B2 | 5/2011 | Yang et al. | |
| 8,122,329 B2 | 2/2012 | Kong et al. | |
| 8,149,607 B2 | 4/2012 | Scheuerlein et al. | |
| 8,194,449 B2 | 6/2012 | Park | |
| 8,264,886 B2 | 9/2012 | Yu et al. | |
| 8,611,150 B2* | 12/2013 | Shin .................... | G11C 11/5642 365/185.03 |
| 2010/0088464 A1 | 4/2010 | Yang | |
| 2011/0058440 A1* | 3/2011 | Smith .................... | G11C 5/141 365/229 |
| 2012/0106247 A1* | 5/2012 | Shin .................... | G11C 11/5642 365/185.03 |
| 2012/0236651 A1 | 9/2012 | Hu | |
| 2012/0239991 A1 | 9/2012 | Melik-Martirosian | |
| 2013/0070524 A1* | 3/2013 | Dutta .................. | G11C 11/5642 365/185.03 |

(Continued)

FOREIGN PATENT DOCUMENTS

KR    1020120063105 A    6/2012

*Primary Examiner* — Richard Elms
*Assistant Examiner* — Xiaochun L Chen
(74) *Attorney, Agent, or Firm* — Volentine & Whitt, PLLC

(57) ABSTRACT

A method, executed by a memory controller, for estimating read levels of a nonvolatile memory includes reading voltages stored by memory cells of a page space within the nonvolatile memory to which pilot signals of a predetermined symbol are programmed. The number of memory cells are identified whose voltages, read from the page space, are less-than/greater-than a read-voltage applied in reading the voltages stored by the memory cells. A voltage to be applied for reading data stored in the page space is estimated based upon the identified number of memory cells.

14 Claims, 3 Drawing Sheets

(56) References Cited

U.S. PATENT DOCUMENTS

2016/0148700 A1\* 5/2016 Oh ..................... G06F 12/0246
  365/185.12
2016/0155495 A1\* 6/2016 Oh ..................... G06F 12/0246
  365/185.03

\* cited by examiner

METHOD AND APPARATUS FOR ESTIMATING READ LEVELS OF NONVOLATILE MEMORY AND FOR PROGRAMMING PILOT SIGNALS USED FOR SUCH ESTIMATION

BACKGROUND

1. Technical Field

The present disclosure relates to optimizing read levels of a nonvolatile memory by inserting pilot signals in unused bytes of a memory page.

2. Description of the Related Art

Data Compression:

Data compression and de-duplication are used to improve write amplification by programming two or more compressed pages to the same physical address. A related-art compression method applies compression to 8 KB pages (or 4 KB sectors). If two pages are both compressed to less than 4 KB each or four sectors are compressed to less than 2 KB each, they may be written to the same physical address. Pages that are not compressed to less than 50% of their initial size are written to memory without compression.

More complex methods for combining compressed pages also exist. These methods include keeping a buffer of N compressed pages and attempting to match pages whose total size is lower than 8 KB. Another such method keeps a few program buffers of size 8 KB and attempts to optimally fill the buffers with incoming compressed pages. However, dividing a data unit (e.g., a sector of 4 kB or page of 8 kB) between different physical locations (pages/addresses) results in degradation in read performance, in that reading those sectors will take twice as long.

Both the simple and complex techniques suffer from the following problem. The techniques do not use the space remaining after joining two or more pages together. For example, if two pages of size 8 KB are compressed to 40% of their initial size each, only 80% (6.4 KB) of the physical page will be programmed with data. In this case, the remaining 20% will not be utilized to achieve additional gain. The same concept applies for 16 kB pages, as well. Therefore, the remaining free space is not put to a useful purpose.

Read Level Optimization:

Methods to optimize read levels include one-shot estimation and read-voltage tracking loop (RVTL). With one-shot estimation, a first read is performed, followed by a count of cells above/below a selected threshold. According to the count, optimal levels are selected from a predefined table. The first (estimation) read is usually set for the high voltage symbol (P3 for MLC or P7 for TLC). The first read level is selected to be the optimal read level for a certain retention scenario. This optimization scheme requires an additional one read in the worst case. The one-shot estimation scheme relies on the presumptions that the data is uniformly distributed between levels and that errors between symbols do not influence the count significantly.

RVTL provides feedback convergence to optimal read levels. A first read is performed, followed by a count of cells above/below a selected threshold. If the count is too high/low the read level is shifted by $\Delta V$ to the right direction. This procedure continues until convergence to an optimal $\Delta V$. This scheme increases read duration, but relies on the presumptions that the data is uniformly distributed between levels and that errors between symbols do not influence the count significantly.

SUMMARY

An example embodiment of the disclosure provides a method, executed by a memory controller, for estimating read levels of a nonvolatile memory. The method includes: reading voltages stored by memory cells of a page space within the nonvolatile memory to which pilot signals of a predetermined symbol are programmed; identifying the number of memory cells whose voltages, read from the page space, are less-than/greater-than a read-voltage applied in reading the voltages stored by the memory cells; and estimating a voltage to be applied for reading data stored in the page space based upon the identified number of memory cells.

The method may further include estimating multiple voltages to be applied for reading the data stored in the page space based upon the identified number of memory cells.

The data stored in the page space may include compressed data, of a data page, that occupies less than all of the memory cells of the nonvolatile memory allocated to the page space.

The pilot signals may occupy a plurality of the remaining memory cells, allocated to the page space, that are not occupied by the compressed data.

The pilot signals may occupy all of the remaining memory cells, allocated to the page space, that are not occupied by the compressed data.

The method may further include reading the data stored in the page space using the estimated voltage.

The voltage to be applied in reading the data stored in the page space may be estimated using a one-shot read-level selection scheme.

The voltage to be applied in reading the data stored in the page space may be estimated using a read-voltage tracking loop (RVTL) read-level selection scheme.

The voltage to be applied in reading the data stored in the page space may be estimated using a read-level optimization scheme.

The method may further include: a) reading voltages stored by memory cells of the page space to which other pilot signals of another predetermined symbol are programmed; b) identifying the number of memory cells whose voltages, read from the page space in operation (a), are less-than/greater-than another read-voltage applied in reading the voltages stored by the memory cells in operation (a); and c) estimating another voltage to be applied for reading the data stored in the page space based upon the number of memory cells identified in operation (b).

Another example embodiment of the disclosure provides a method, executed by a memory controller, for programming a page space of a nonvolatile memory. The method includes: mapping data to the page space of the nonvolatile memory; mapping pilot signals of a predetermined symbol to a meta data area of the page space or locations of the page space to which the data has not been mapped; and programming the mapped data and pilot signals into the page space of the nonvolatile memory.

The method may further include compressing a data page to a size less than that of a full page. The data stored in the page space may include the compressed data page.

The data stored in the page space may further include data of another data page.

The data of the other data page may also be compressed data.

The pilot signals of the predetermined symbol may be programmed into each memory cell of the page space to which the data was not mapped.

The method may further include programming pilot signals of another predetermined symbol into the meta data area of the page space or locations of the page space to which neither the data nor the pilot signals of the predetermined symbol were mapped. The pilot signals of the predetermined symbol may differ from the pilot signals of the other predetermined symbol.

Another example embodiment of the disclosure provides a memory device for estimating read levels of a nonvolatile memory. The apparatus includes the nonvolatile memory and a memory controller. The memory controller: reads voltages stored by memory cells of a page space within the nonvolatile memory to which pilot signals of a predetermined symbol are programmed; identifies the number of memory cells whose voltages, read from the page space, are less-than/greater-than a read-voltage applied in reading the voltages stored by the memory cells; and estimates a voltage to be applied for reading data stored in the page space based upon the identified number of memory cells.

The memory controller may further estimate multiple voltages to be applied for reading the data stored in the page space based upon the identified number of memory cells.

The data stored in the page space may include compressed data, of a data page, that occupies less than all of the memory cells of the nonvolatile memory allocated to the page space.

The memory controller may further: a) read voltages stored by memory cells of the page space to which other pilot signals of another predetermined symbol are programmed; b) identify the number of memory cells whose voltages, read from the page space in operation (a), are less-than/greater-than another read-voltage applied in reading the voltages stored by the memory cells in operation (a); and c) estimate another voltage to be applied for reading the data stored in the page space based upon the number of memory cells identified in operation (b).

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION OF EMBODIMENTS

The advantages and features of the present disclosure and methods of achieving them will be apparent from the following example embodiments that will be described in more detail with reference to the accompanying drawings. It should be noted, however, that the present disclosure is not limited to the following example embodiments, and may be implemented in various forms. Accordingly, the embodiments are provided only to exemplify the present disclosure and let those skilled in the art know the concept of the present disclosure.

The terms used in the present disclosure are for the purpose of describing particular embodiments only and are not intended to be limiting of the present disclosure. As used in the specification, the singular forms "a", "an" and "the" are intended to include the plural forms as well, unless the context clearly indicates otherwise. It will be further understood that the terms "comprises" and/or "comprising", when used in the present disclosure, specify the presence of stated features, integers, steps, operations, elements, and/or components, but do not preclude the presence or addition of one or more other features, integers, steps, operations, elements, components, and/or groups thereof.

As used herein, a "/" indicates a selection of the item preceding the "/" or the item following it. For example, "A/B" indicates that one of item A and item B may be selected.

Hereinafter, example embodiments of the present disclosure will now be described more fully with reference to accompanying drawings.

Compression of input data reduces the number of information bits to be written in every page from an amount L to an amount R*L, where R<=1 and indicates the ratio of compression and L is typically 4 KB or 8 KB. Accordingly, (1−R)*L bytes do not contain any information and remain un-programmed. These un-programmed (1−R)*L bytes, or some portion of them, may be put to use for determining optimal read levels. If no un-programmed bytes exist, meta data space may be used to store pilot symbols.

Figure 1:
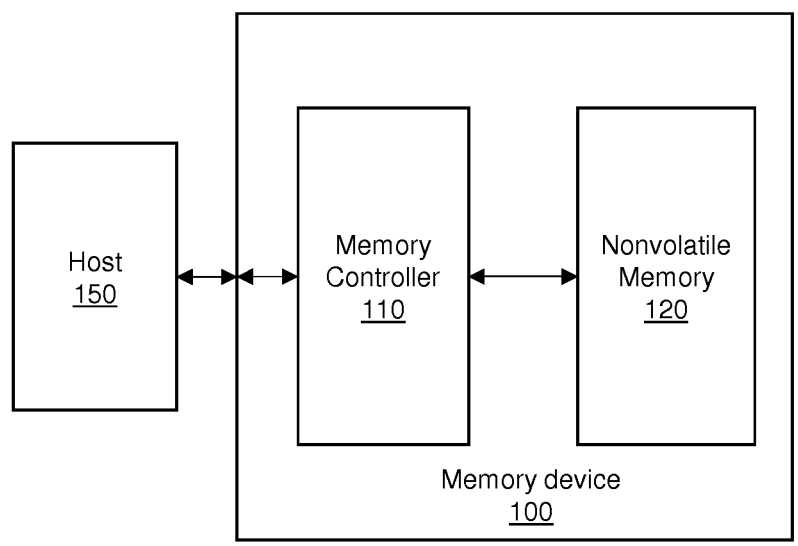
FIG. 1 illustrates a data storage system according to an embodiment of the disclosure.

FIG. 1 illustrates a data storage system according to an embodiment of the disclosure. The data storage system includes a memory device 100 and a host computer 150. Memory device 100 includes a memory controller 110 and a nonvolatile memory 120. Memory device 100 may include other components, such as address decoders, one or more input/output data buffers, a voltage generator, a random access memory (RAM), a power source, etc., but such components are not illustrated or described further as their functionality is unimportant to the subject matter of the disclosure. Memory controller 110 receives data from host 150 for storage in nonvolatile memory 120 and reads data stored by nonvolatile memory 120 for conveyance to host 150 upon request by host 150. Nonvolatile memory 120 may be a NAND memory, a NAND flash memory, a memory with retention defects, or a memory that requires time-variant optimal read references. A micro-controller may exist in nonvolatile memory 120 (e.g. the NAND flash) itself.

Figure 2:
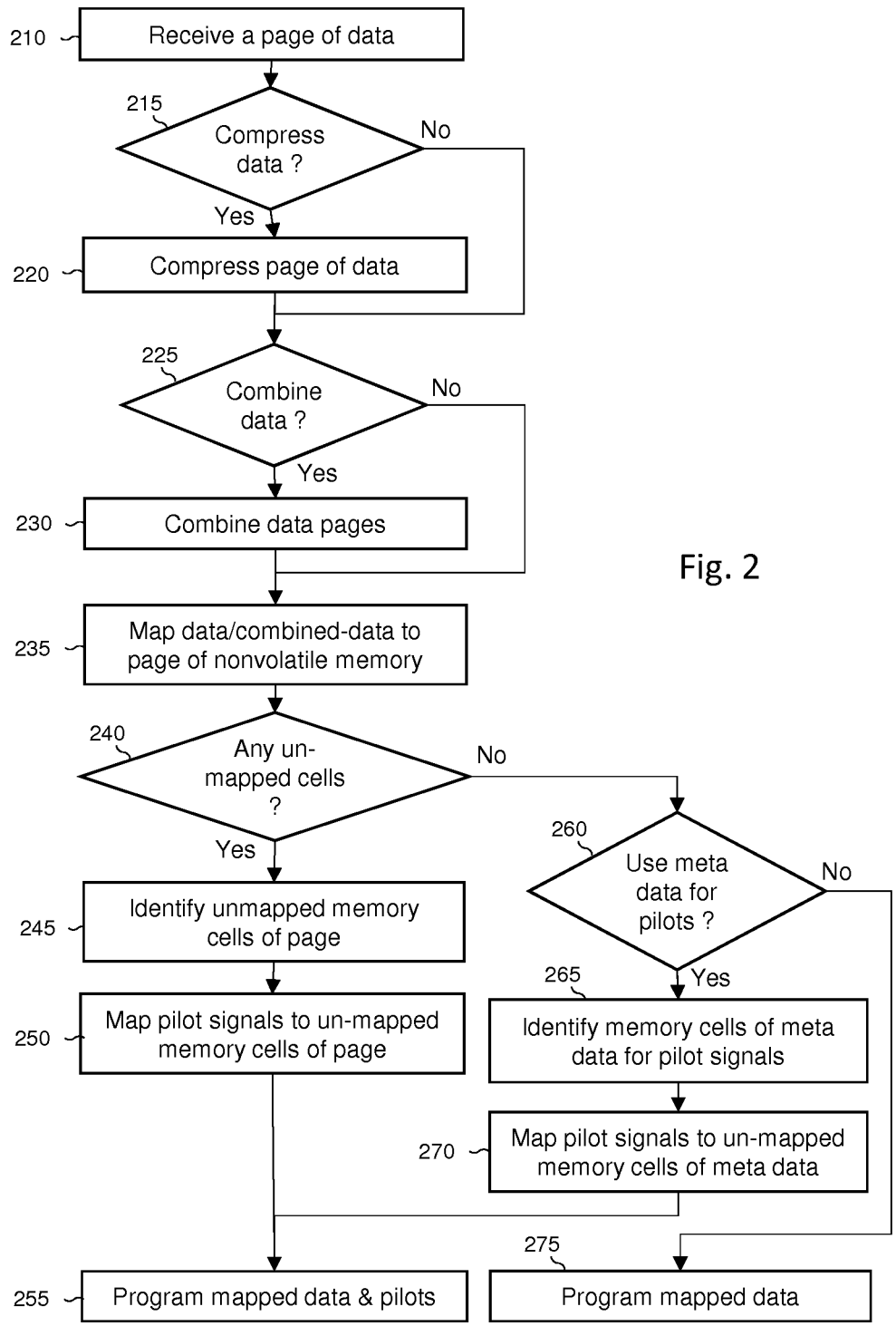
FIG. 2 illustrates a method of writing a page of data to a memory, according to an embodiment of the disclosure.

FIG. 2 illustrates a method of writing a page of data to a memory, according to an embodiment of the disclosure. According to this method, memory controller 110 receives 210 a page of data from host 150 to be stored in nonvolatile memory 120. Memory controller 110 determines 215 whether to compress the page of data. If the determination 215 is affirmative, memory controller 110 compresses 220 the page of data to reduce its size to less than that of a full page and proceeds to operation 225. If the determination 215 is negative, memory controller 110 proceeds directly to operation 225 without compressing the page of data.

Memory controller 110 determines 225 whether to combine the compressed/uncompressed page with data of one or more other pages. The data of the one or more other pages may be uncompressed data from one or more other pages, compressed data from one or more other pages, or one or more compressed pages. If determination 225 is affirmative, then memory controller 110 combines 230 the compressed/uncompressed page with the data of the one or more other pages. Thereafter, memory controller 110 maps 235, to a page of storage space, the compressed/uncompressed page in combination with the data of the one or more other pages. If memory controller 110 determines 225 not to combine the compressed/uncompressed page with data of one or more other pages, then memory controller 110 proceeds directly to operation 235.

Memory controller 110 maps 235 data to memory cells of a page space within nonvolatile memory 120. The mapped data may or may not include compressed data, as compressed in operation 220, and may or may not include combined data, as combined in operation 230, but includes the received page of data. Memory controller may map 235 the data to the page according to a predetermined algorithm. For example, if less than an entire page of data is available for mapping, memory controller 110 may map the available data so that un-mapped memory cells are scattered over the word line of the page in a predetermined manner.

Memory controller 110 determines 240 whether the page space to which the data was mapped in operation 235 contains any un-mapped memory cells. For example, if all of the data mapped to the page space of nonvolatile memory 120 in operation 235 will occupy only 95% of the page space of nonvolatile memory 120, then 5% of the page space will contain un-mapped memory cells. If un-mapped memory cells are determined 240 to exist in the page space, memory controller 110 proceeds to operation 245. Otherwise, memory controller proceeds to operation 260. Un-mapped memory cells within the page may exist due to the successfulness of the data compression, a mismatch between physical and logical addressing granularity, or other reasons.

If un-mapped memory cells are determined 240 to exist, memory controller 110 identifies 245 the locations of these un-mapped memory cells within the page to be programmed within nonvolatile memory 120. Memory controller 110 may additionally identify 245 un-mapped memory cell locations within the meta data area of the page of nonvolatile memory 120 Memory controller 110 maps 250 pilot signals to some or all of the identified 245 un-mapped memory cells. The pilot signals may have the same or differing symbols. After the pilot signals are mapped 250, memory controller 110 programs 255 the mapped data and pilot signals into the mapped page space of nonvolatile memory 120.

If un-mapped cells are determined 240 not to exist in the mapped page space, memory controller 110 determines 260 whether to map pilot signals to a meta data area of the mapped page. If determination 260 is affirmative, memory controller 110 identifies 265 un-mapped memory cell locations within the meta data area of the page of nonvolatile memory 120 that will be programmed with pilot signals. If determination 260 is negative, memory controller 110 programs 275 the data mapped in operation 235 to a page of nonvolatile memory 120.

Upon identifying 265 the locations of memory cells within the meta data area of the page, memory controller 110 maps 270 pilot signals to some or all of the identified 265 memory cells of the meta data area of the page. The pilot signals may have the same or differing symbols. After the pilot signals are mapped 270, memory controller 110 programs 255 the mapped data and pilot signals into the mapped page space of nonvolatile memory 120.

As an example of mapping pilot signals of different symbols to the memory cells of a page space of nonvolatile memory 120, first pilot signals of a first symbol may be mapped to a first group of the memory cells of the page space, second pilot signals of a second symbol may be mapped to a second group of the memory cells of the page space, . . . , and $j^{th}$ pilot signals of a $j^{th}$ symbol may be mapped to a $j^{th}$ group of the memory cells of the page space.

The pilot symbols can be scattered anywhere within the page space, so as to allow each sector to have such pilot information.

Figure 3:
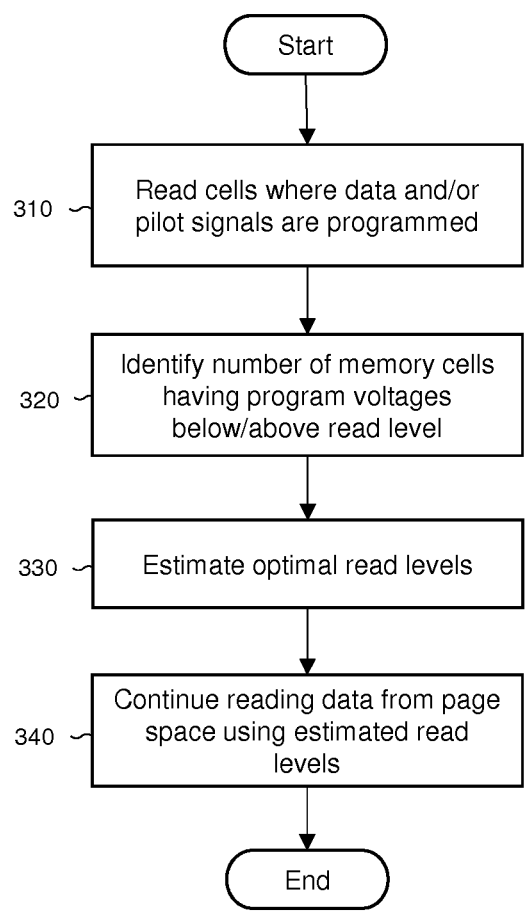
FIG. 3 illustrates a method of estimating read levels used for reading data from a memory, according to an embodiment of the disclosure.

FIG. 3 illustrates a method of estimating read levels used for reading data from a memory, according to an embodiment of the disclosure. According to this method, memory controller 110 reads 310, memory cells of a page space within nonvolatile memory 120 where pilot signals of a symbol are programmed. Other memory cells of the page space may also be read while the memory cells with the pilot signals are being read. A predetermined read voltage is applied in reading 310 the memory cells of the page space. Memory controller 110 identifies 320, among the read memory cells to which the pilot signals were programmed, the number of cells storing voltages below/above the predetermined read level applied in operation 310.

Memory controller 110 estimates 330, based upon the number of cells identified in operation 320, the retention period and the optimal read levels for the data written to the page space. Such estimation may be done according to principles known in the art, including the one-shot and RVTL estimation schemes described herein. Thereafter, memory controller 110 continues reading 340 data from the page space of nonvolatile memory 120 using the optimal read levels estimated in operation 330. This data may include uncompressed data, compressed data, or a combination of the two. Additionally, this data may include data from one or multiple pages.

Operations 310 through 340 may be performed multiple times to improve the estimate of the optimal read levels. Each iteration of the sequence of operations 310 through 340 may employ a different predetermined read voltage in reading 310 the memory cells of the page space where the pilot signals are programmed.

The use of pilots signals, described above, reduces the estimation error due to changes in symbol mapping distribution and due to errors between symbols (hard-decision errors). Thus, a better read level estimation is achieved without compromising read duration and without estimation complexity.

In an example of the above-described subject matter, suppose data of a data page is compressed to 95% of the size of the data page. After such compressed data is written to a page space of nonvolatile memory 120, 0.05*L un-programmed cells would exist in the page space of nonvolatile memory 120. Assuming the page space is L=8000 B, 400 bytes of the page space would remain un-programmed.

Further assuming that each cell of the page space within nonvolatile memory 120 stores 3 bits of data, memory controller 110 may map a 3-bit P7 pilot signal to each of the 400 un-programmed bytes. Memory controller 110 performs a read operation on the cells of the page space to which the P7 pilot signal was programmed and counts the number of such cells having a program voltage below/above the voltage applied in this read operation. Based upon this count, memory controller 110 estimates optimal read voltages to apply in reading the compressed data from the page space. Thereafter, memory controller 110 reads the compressed data from the page space using the estimated read levels.

Although embodiments of the disclosure have considered the circumstance of writing compressed data to a page space of a nonvolatile memory, the principles described herein apply whenever the page space of a nonvolatile memory is unfilled by data to be stored, whether the unfilled space exists due to data compression or some other reason. For example, if less than a full page of uncompressed data is stored within a page space of the nonvolatile memory, then the un-programmed space may be used to store the pilot signals described herein for use in read-level estimation. For example, when logical sectors are written in granularity of 512 B while physical mapping is done with granularity of 4 kB.

Additionally, although the principles described herein have been applied to a page of memory, the principles similarly apply to groupings of memory cells other than that constituting a page.

The device configuration illustrated in each block diagram is provided to help convey an understanding of the present disclosure. Each block may include smaller blocks according to functions. Alternatively, a plurality of blocks may form a larger block according to a function. That is, the present disclosure is not limited to the components illustrated in each block diagram.

The operations illustrated in the drawings are illustrative of one or more embodiments of the disclosure, but are not limited to the sequence illustrated. Some operations may be omitted and additional operations may be included in embodiments of the disclosure. Also, the sequence of the operations may be changed and some operations may be performed either simultaneously or in sequence.

While the present disclosure has been particularly shown and described with reference to example embodiments thereof, the present disclosure is not limited to the above-described example embodiments. It will be understood by those of ordinary skill in the art that various changes and variations in form and details may be made therein without departing from the spirit and scope of the present disclosure as defined by the following claims.

What is claimed is:

1. A method, executed by a memory controller, for estimating read levels of a nonvolatile memory, the method comprising:
    reading voltages stored by memory cells of a page space within the nonvolatile memory to which pilot signals of a predetermined symbol are programmed;
    identifying the number of memory cells whose voltages, read from the page space, are less-than/greater-than a read-voltage applied in reading the voltages stored by the memory cells; and
    estimating a voltage to be applied for reading data stored in the page space based upon the identified number of memory cells, wherein
    the pilot signals are mapped to a meta data area of the page space and the mapped pilot signals are programmed into the page space.

2. The method of claim 1, further comprising estimating multiple voltages to be applied for reading the data stored in the page space based upon the identified number of memory cells.

3. The method of claim 1, wherein the data stored in the page space comprises compressed data, of a data page, that occupies less than all of the memory cells of the nonvolatile memory allocated to the page space.

4. The method of claim 3, wherein the meta data area occupies a plurality of the remaining memory cells, allocated to the page space, that are not occupied by the compressed data.

5. The method of claim 4, wherein the meta data area occupies all of the remaining memory cells, allocated to the page space, that are not occupied by the compressed data.

6. The method of claim 1, further comprising reading the data stored in the page space using the estimated voltage.

7. The method of claim 1, wherein the voltage to be applied in reading the data stored in the page space is estimated using a one-shot read-level selection scheme.

8. The method of claim 1, wherein the voltage to be applied in reading the data stored in the page space is estimated using a read-voltage tracking loop (RVTL) read-level selection scheme.

9. The method of claim 1 wherein the voltage to be applied in reading the data stored in the page space is estimated using a read-level optimization scheme.

10. The method of claim 1, further comprising:
    a) reading voltages stored by memory cells of the page space to which other pilot signals of another predetermined symbol are programmed;
    b) identifying the number of memory cells whose voltages, read from the page space in operation (a), are less-than/greater-than another read-voltage applied in reading the voltages stored by the memory cells in operation (a); and
    c) estimating another voltage to be applied for reading the data stored in the page space based upon the number of memory cells identified in operation (b).

11. A memory device for estimating read levels of a nonvolatile memory, the apparatus comprising:
    the nonvolatile memory; and
    a memory controller that:
    reads voltages stored by memory cells of a page space within the nonvolatile memory to which pilot signals of a predetermined symbol are programmed;
    identifies the number of memory cells whose voltages, read from the page space, are less-than/greater-than a read-voltage applied in reading the voltages stored by the memory cells; and
    estimates a voltage to be applied for reading data stored in the page space based upon the identified number of memory cells.

12. The memory device of claim 11, wherein the memory controller further estimates multiple voltages to be applied for reading the data stored in the page space based upon the identified number of memory cells.

13. The memory device of claim 11, wherein the data stored in the page space comprises compressed data, of a data page, that occupies less than all of the memory cells of the nonvolatile memory allocated to the page space.

14. The memory device of claim 11, wherein the memory controller further:
    a) reads voltages stored by memory cells of the page space to which other pilot signals of another predetermined symbol are programmed;
    b) identifies the number of memory cells whose voltages, read from the page space in operation (a), are less-than/greater-than another read-voltage applied in reading the voltages stored by the memory cells in operation (a); and
    c) estimates another voltage to be applied for reading the data stored in the page space based upon the number of memory cells identified in operation (b).

* * * * *